United States Patent [19]
Tonai

[11] Patent Number: 6,114,737
[45] Date of Patent: Sep. 5, 2000

[54] LIGHT-RECEIVING DEVICE

[75] Inventor: Ichiro Tonai, Konohana-ku, Japan

[73] Assignee: Sumitomo Electric Industries, Ltd., Osaka, Japan

[21] Appl. No.: 08/348,991

[22] Filed: Nov. 28, 1994

Related U.S. Application Data

[63] Continuation of application No. 08/005,419, Jan. 19, 1993, abandoned, which is a continuation of application No. 07/612,435, Nov. 14, 1990, abandoned.

[30] Foreign Application Priority Data

Nov. 14, 1989 [JP] Japan ................................ 1-296865

[51] Int. Cl.[7] ..................... H01L 31/0203; H01L 31/0232
[52] U.S. Cl. .............................................. 257/434; 257/437
[58] Field of Search .................................. 357/31, 32, 30

[56] References Cited

U.S. PATENT DOCUMENTS

| | | | |
|---|---|---|---|
| 3,703,669 | 11/1972 | London ................................... | 357/31 |
| 3,845,296 | 10/1974 | Schnitzler ............................... | 257/10 |
| 3,858,233 | 12/1974 | Miyata et al. ........................... | 357/31 |
| 4,044,373 | 8/1977 | Nomiya et al. .......................... | 357/41 |

FOREIGN PATENT DOCUMENTS 0228712  7/1987  European Pat. Off. .

OTHER PUBLICATIONS

Kaede, et al, "12–Channel Parallel Optical–Fiber Transmission Using A Low–Drive Current 1.3μm LED Array and a p–i–n PD Array", Journal Of Lightwave Technology, vol. 8, No. 6, Jun. 1990, pp. 883–888.

Ota, et al, "Twelve–Channel Individually Addressable InGaAs/InP p–i–n Photodiode and InGaAsP/InP LED Arrays in a Compact Package", Jounal Of Lightwave Technology, vol. LT–5, No. 8, Aug., 1987, pp. 1118–1122.

S.R. Forrest, "Monolithic Optoelectronic Integration: A New Component Technology for Lightwave Communications", IEEE Transactions Of Electron Devices, vol. ED–32, No. 12, Dec., 1985, pp. 2640–2655.

S.R. Forrest, Member, IEEE, "Monolithic Optoelectronic Integration: A New Component Technology for Lightwave Communications", 8217 Jounal Of Lightwave Technology LT–3 (1985) Dec., No. 6, pp. 1248–1263, IEEE Transactions On Electron Devices, vol. ED–32, pp. 2640–2655.

*Primary Examiner*—Jerome Jackson, Jr.
*Assistant Examiner*—B William Baumeister
*Attorney, Agent, or Firm*—Pillsbury Madison & Sutro LLP

[57] ABSTRACT

There is disclosed a light-receiving device comprising an absorption layer formed of a semiconductor material which is capable of generating electric charges in response to an incident light, a plurality of light-detecting regions formed in the absorption layer, each outputting an electric signal in response to an incident light signal, and a depletion region formed between the adjacent light-detecting regions for collecting electric charges generated in a portion of the absorption layer between the adjacent light-detecting regions.

15 Claims, 6 Drawing Sheets

LIGHT-RECEIVING DEVICE

This is a continuation of application Ser. No. 08/005,419, filed on Jan. 19, 1993, which was abandoned upon the filing hereof which is a continuation of application Ser. No. 07/612,435 filed Nov. 14, 1990 (now abandoned).

BACKGROUND OF THE INVENTION 1. (Field of the Invention)

The present invention relates to a light-receiving device, e.g. a PD (photo diode) array and a Schottky diode array having a plurality of light-detecting regions formed on a semiconductor material, and an optical connector using the same and, more particularly, to a light-receiving device which can minimize crosstalk among light-detecting regions, and an optical connector using the same.

2. (Related Background Art)

In the field of optical communication, parallel signal transmission using a plurality of parallel optical fibers has been attempted to realize a large-capacity communication system using conventional PDs and LDs. From this point of view, development of integrated PDs and LDs used in parallel signal transmission has been expected.

Figure 9A:
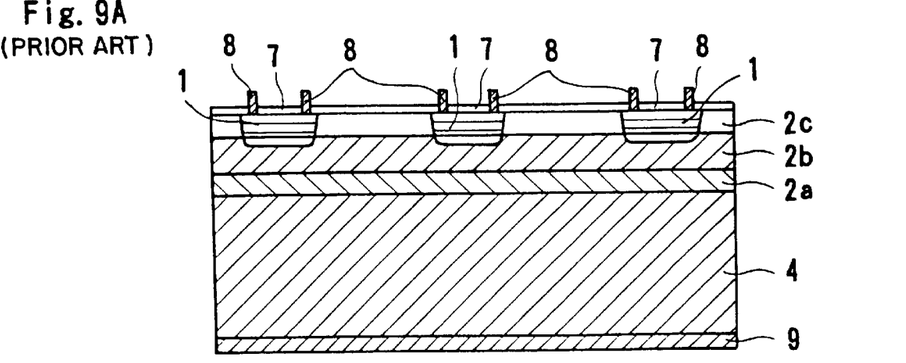
FIGS. 9A, 9B, and 9C are sectional views of conventional PD arrays.
Figure 9B:
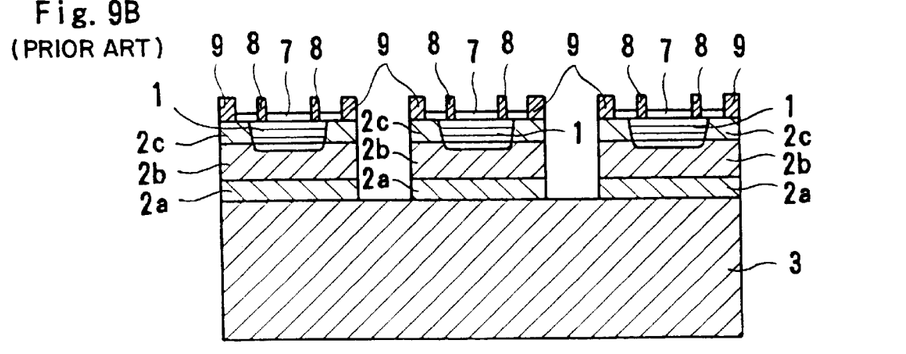
Figure 9C:
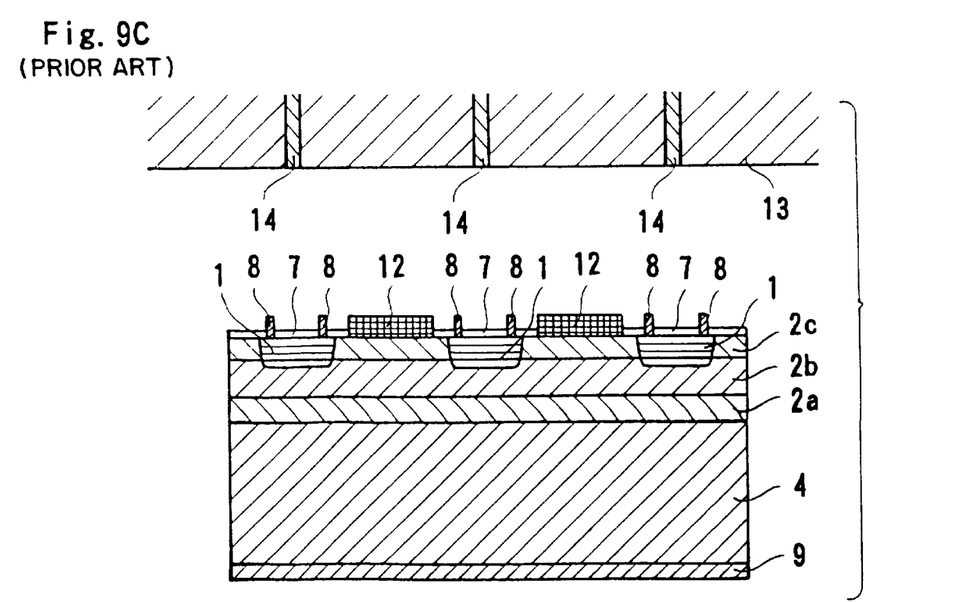

As an integrated optical device of this type, PD arrays having sectional structures shown in FIGS. 9A, 9B, and 9C have been proposed.

In a PD array shown in FIG. 9A, semiconductor crystals 2a, 2b, and 2c of a first conductivity type are grown on a substrate 4, and an impurity is selectively diffused in semiconductor crystals 2b and 2c to form regions 1 of a second conductivity type, thus forming PIN-PD structures serving as light-detecting regions (e.g., Society of Electronic Information Communications, national spring meeting, 1988, C-352).

In the device having the structure shown in FIG. 9A, however, light incident on a portion between adjacent light-detecting regions is absorbed by the absorption layer 2b, and an electric charge is generated in this region. The electric charge generated in the absorption layer 2b is diffused in a lateral direction, and is undesirably flowed into the region 1 of the second conductivity type. Accordingly, a current flows into the PIN-PD structure from the absorption layer, thus posing the following problems: (1) an electric charge generated outside a light-detecting region is superposed on a signal current and causes crosstalk; and (2) a response time of an array is prolonged by a diffusion current having a low response speed.

In a PD array having a structure shown in FIG. 9B, semiconductor crystals 2a, 2b, and 2c of a first conductivity type are grown on a semiinsulating substrate 3, and light-detecting regions are then formed in the same manner as in FIG. 8A. Subsequently, a portion of the semiconductor crystals 2a, 2b, and 2c between adjacent light-detecting regions is removed until the semiinsulating substrate 3 is exposed (e.g., Society of Electronic Information Communications, national fall meeting, 1989, C-225).

In the PD array having the structure shown in FIG. 9B, because of partial etching of the semiconductor crystals 2a, 2b, and 2c, lateral diffusion of an electric charge can be prevented, and the above-mentioned problems can be solved. However, since steps are inevitably formed on the surface of the PD array, such structure causes errors occurring due to a non-flat surface during a fabrication process (e.g., photolithographic errors), or a structure of a device protective film may become incomplete.

In a PD array having a structure shown in FIG. 9C, after light-detecting regions 1 of a second conductivity type are formed in semiconductor crystals 2a, 2b, and 2c of a first conductivity type in the same manner as in FIG. 9A, a metal film 12 is formed on the surface of the semiconductor crystal 2a between the adjacent light-detecting regions.

In the PD array having the structure shown in FIG. 9C, since the metal film 12 is formed on the surface of the semiconductor crystal 2c to shield incidence of stray light on a portion outside the light-detecting regions, crosstalk caused by lateral diffusion of an electric charge can be prevented. However, incident light is multiple-reflected between the surface of the metal film 12 and a surface of an optical fiber connector 13, and stray light is undesirably transmitted to an adjacent light-detecting region. Thus, the stray light incident on the adjacent light-detecting region often causes crosstalk.

SUMMARY OF THE INVENTION

It is an object of the present invention to provide a light-receiving device which has a structure allowing easy working of semiconductor materials, and can prevent crosstalk between adjacent light-detecting regions.

It is another object of the present invention to provide a light-receiving device which has a flat or planar structure, and in which a portion of an absorption layer between adjacent light-detecting regions is depleted. Since such a light-receiving device has a flat structure, it is easy to work. Since a portion of the absorption layer between adjacent light-detecting regions is depleted, crosstalk caused by signal light incident on a portion between the adjacent light-detecting regions can be prevented.

It is still another object of the present invention to provide a light-receiving device which has a flat structure and in which an impurity is doped in or near an absorption layer to deplete a portion of the absorption layer between adjacent light-detecting regions.

It is still another object of the present invention to provide a light-receiving device which has a flat or planar structure, and in which a Schottky electrode is formed on the upper surface of an absorption layer to deplete a portion of the absorption layer between adjacent light-detecting regions.

It is still another object of the present invention to provide a light-receiving device which has a flat structure, in which a portion of an absorption layer between adjacent light-detecting regions is depleted, and in which an anti-reflection film is formed on the upper surface of the light-detecting regions. The anti-reflection film can prevent generation of stray light, and can further eliminate a possibility of crosstalk between adjacent light-detecting regions.

It is still another object of the present invention to provide a light-receiving device which has a structure allowing easy working of semiconductor materials, and can prevent noise generated in an electronic circuit adjacent to light-detecting regions.

It is still another object of the present invention to provide an optical connector which has a structure allowing easy working, and can facilitate alignment between a plurality of optical fibers and a light-receiving device for independently detecting signal light from these optical fibers.

It is still another object of the present invention to provide an optical connector which has a structure allowing easy working, and can prevent crosstalk between adjacent light-detecting regions formed in a light-receiving device.

It is still another object of the present invention to provide an optical connector in which a light-receiving device having a plurality of light-detecting regions for independently detecting signal light from a plurality of optical fibers is formed on a semiconductor material to have a flat structure, and a portion of an absorption layer between adjacent light-detecting region is depleted.

It is still another object of the present invention to provide an optical connector in which a light-receiving device having a plurality of light-detecting regions for independently detecting signal light from a plurality of optical fibers is formed on a semiconductor material to have a flat structure, a portion of an absorption layer between adjacent light-detecting region is depleted, and an anti-reflection film is formed on the surface of each light-detecting region.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENT

Figure 1A:
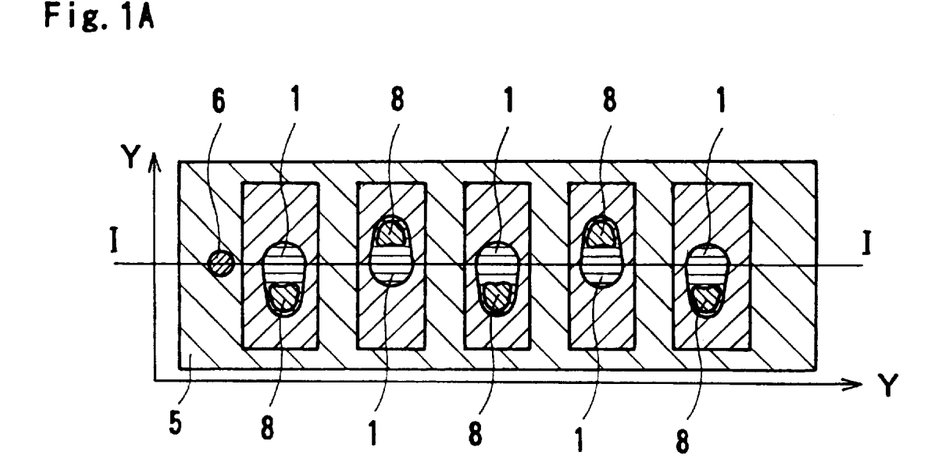
FIG. 1A is a plan view of a PIN-PD array according to the first embodiment of the present invention.
Figure 1B:
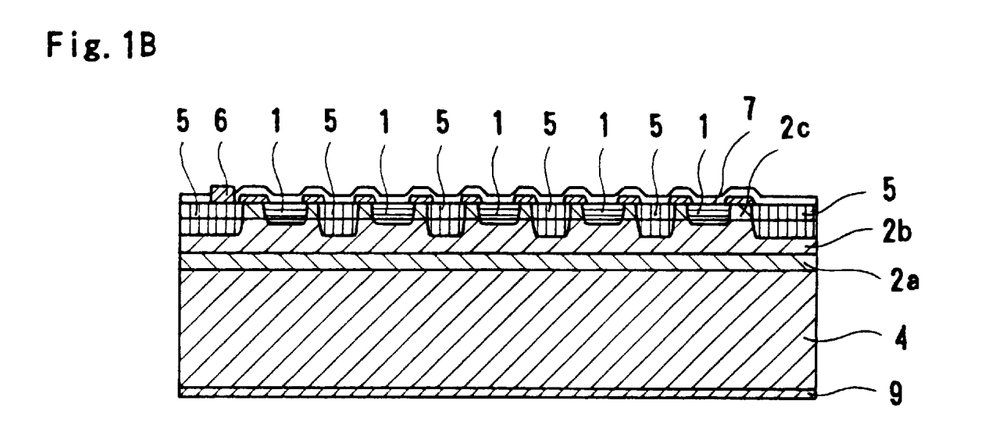
FIG. 1B is a sectional view taken along a line I—I of the PIN-PD array shown in FIG. 1A.

FIGS. 1A and 1B are respectively a plan view showing a PIN-PD array according to the first embodiment, and a sectional view taken along a line I—I in FIG. 1A. In FIGS. 1A and 1B, reference numeral 4 denotes an n$^+$-type (first conductivity type) InP substrate. A nondoped InP buffer layer 2a (n=2×10$^{15}$ cm$^{-3}$, thickness=2 μm), a nondoped InGaAs absorption layer (or photoelectric conversion layer) 2b (n=2×10$^{15}$ cm$^{-3}$, thickness=3.5 μm), and a nondoped InP window layer 2c (n=2×10$^{15}$ cm$^{-3}$, thickness=2 μm) are sequentially grown on the substrate 4. Subsequently, an impurity Zn is selectively diffused in the layers 2b and 2c by sealed ampoule method (impurity doping method using a sealed silica tube including a semiconductor wafer and an impurity material), thereby forming regions 1 and 5 of a second conductivity type. In this embodiment, regions 1 of the second conductivity type correspond to PIN-PDs or light-detecting regions, and a region 5 of the second conductivity type corresponds to a depleted region surrounding PIN-PDs. As is shown in FIG. 1B, the boundary between the outermost portions of collecting regions 5 and the absorption layer 2b is exposed to the edge of the PIN-PD array.

The diameter of each region 1 of the second conductivity type is 100 μm, and five light-detecting regions are formed in line. Since a distance between the centers of the adjacent regions 1 of the second conductivity type is 250 μm, an interval therebetween is 150 μm. The 90-μm wide region 5 of the second conductivity type is formed at almost the center of the 150-μm interval, and is formed to surround the light-detecting regions, as shown in FIG. 1A.

P- and n-side electrodes 8 and 9 of the PIN-PD array apply a bias voltage to the regions 1 of the second conductivity type formed in the absorption layer 2b, and detect signal charges therefrom. In this case, noise charges collected in the region 5 of the second conductivity type are extracted via the extracting electrode 6 formed on the region 5. The anti-reflection film 7 is formed on the nondoped InP layer 2c.

Figure 2:
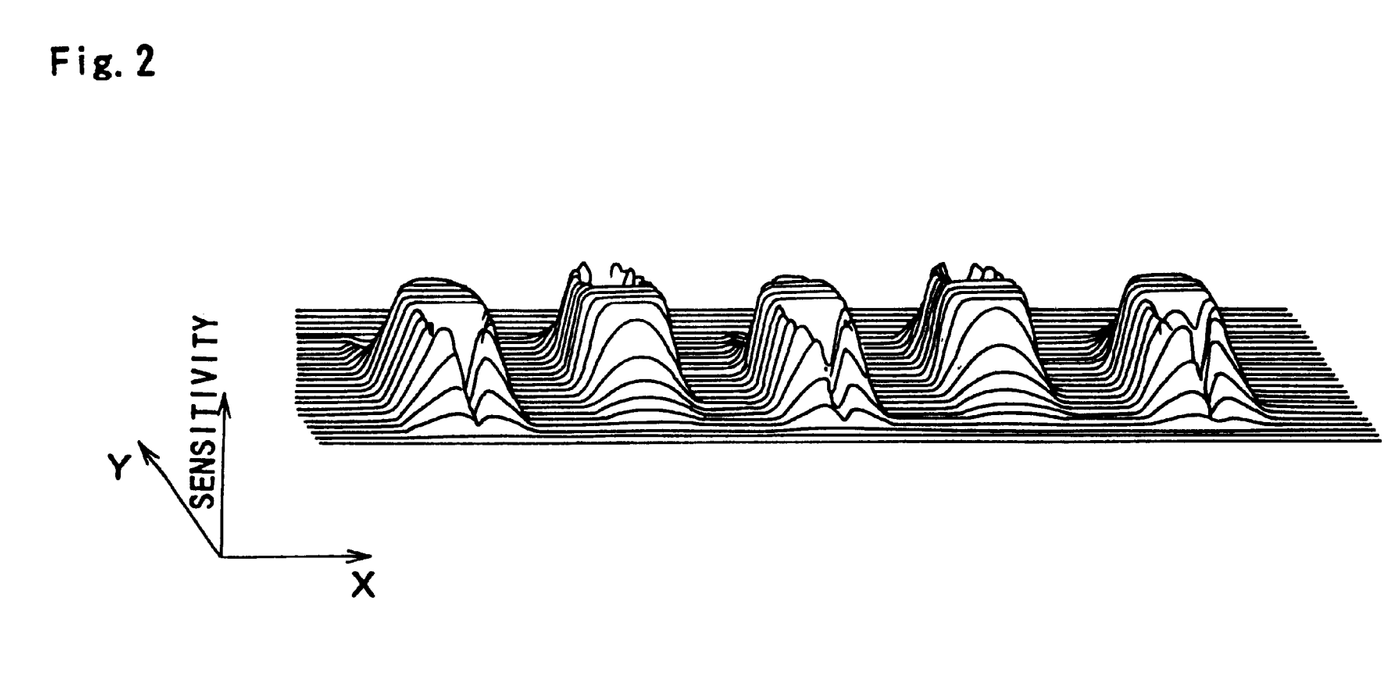
FIG. 2 is a chart showing a distribution of a measured photo sensitivity in the surface of the device of the PIN-PD array shown in FIGS. 1A and 1B.

FIG. 2 shows a measurement result of a distribution of a photosensitivity (or responsivity) of the PIN-PD array of the first embodiment. As can be seen from FIG. 2, no crosstalk caused by stray light incident on the region surrounding the light-detecting region is observed.

In the PIN-PD array shown in FIGS. 1A and 1B, the p-type region 5 formed in the absorption layer is utilized to deplete a part of the region 5 of the second conductivity type and a portion around it between the adjacent light-detecting region. The depleted portion of the absorption layer serves to prevent crosstalk. More specifically, when light directed to the light-detecting device becomes incident on the absorption layer between the adjacent light-detecting regions, an electric charge generated in the region is collected in the depleted portion, and can be prevented from flowing into the light-detecting regions. Therefore, crosstalk caused by light incident on a portion other than the light-detecting regions can be prevented.

Since a current due to lateral diffusion, i.e., which flows due to a carrier density gradient has a low response speed, the response speed of the PIN-PD array may be decreased by this current. However, since the PIN-PD array of the present embodiment can exclude the current caused by lateral diffusion, a decrease in response speed of the PIN-PD array can be prevented.

Furthermore, since the anti-reflection film 7 is formed on the regions 1 and 5 of the second conductivity type, stray light can be reduced. More specifically, when no anti-reflection film 7 is formed, light which is not incident on the light-detecting regions is multiple-reflected between the surface of the semiconductor crystal 2 and the surface of, e.g., an optical fiber connector and may reach adjacent light-detecting regions. According to the present invention, since the anti-reflection film 7 is formed, crosstalk caused by multiple reflection can also be eliminated. The anti-reflection film is formed of, e.g., $SiN_x$, $SiO_2$, or the like, and is formed by, e.g., plasma CVD or thermal CVD.

Figure 3:
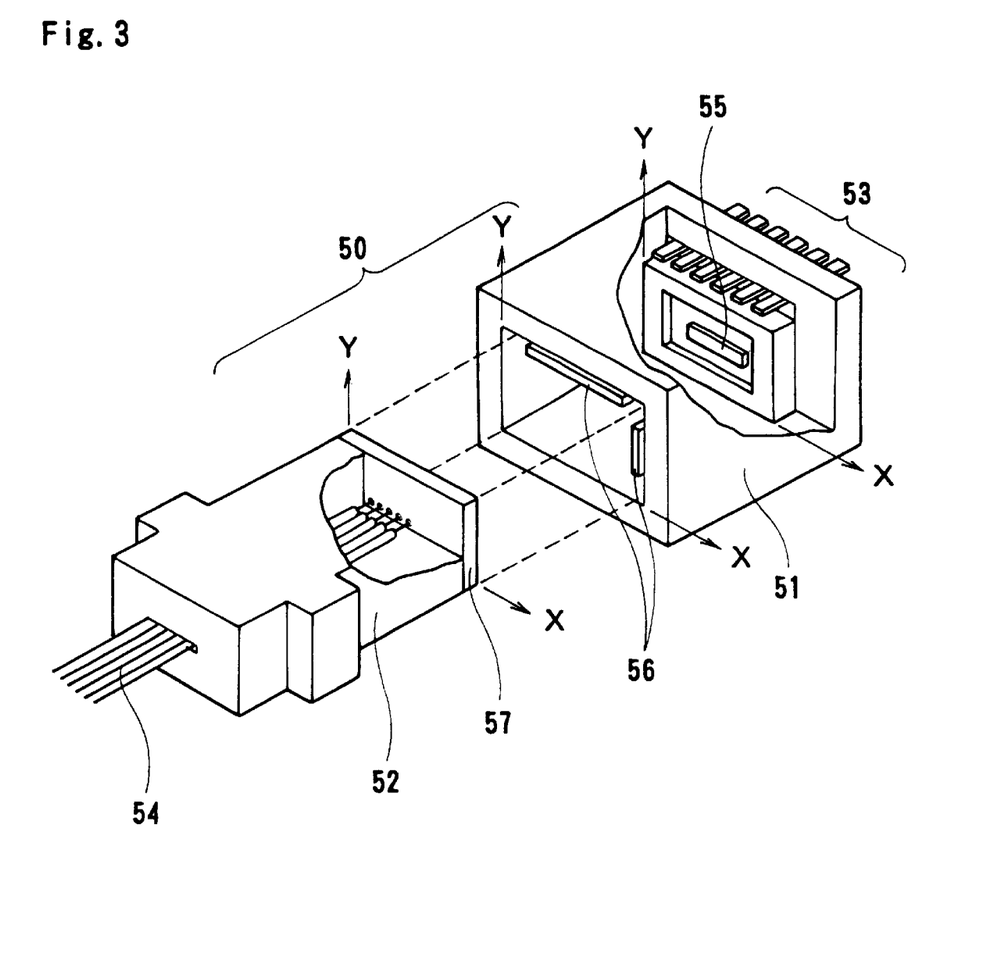
FIG. 3 is a perspective view of an embodiment of an optical connector using the PIN-PD array of the first embodiment.

FIG. 3 shows a fiber ribbon connector 50 as an embodiment of an optical connector which incorporates the light-receiving device shown in FIGS. 1A and 1B. A PIN-PD array 55 as the light-receiving device is fixed to a package 51 of the fiber ribbon connector 50. Six bonding wires extending from p-side electrodes 8 and the extracting electrode 6 formed on the PIN-PD array 55, are connected to leads 53. A fiber ribbon 54 consisting of five optical fibers is fixed to a plug 52 of the fiber ribbon connector 50. The distal end of the fiber ribbon 54 is fixed to a steel plate 57. When the plug 52 is entirely inserted in the package 51, the distal end of the plug 52 is stopped just before the front surface of the PIN-PD array 55. The light-detecting regions of the PIN-PD array 55 face to the optical fibers at the distal end of the fiber ribbon 54, so that each five light-detecting regions are optically coupled to each five optical fibers independently. Two spring plates 56 in the package 51 press the metal plug 52 against the two rectangular metal surfaces inside the package 51 to keep the plug 52 in tight contact with the package 51. As a result, a large dimensional tolerance can be obtained in optical coupling between the light-detecting regions and the optical fibers.

Since a depletion layer is formed in the absorption layer between the light-detecting regions in the PIN-PD array shown in FIG. 3, a dimensional tolerance of, e.g., the plug, the package, and the like for optical coupling is very large. Alternatively, a degree of integration of the light-detecting regions can be increased while maintaining the dimensional precision of, e.g., the plug, the package, and the like.

Figure 4:
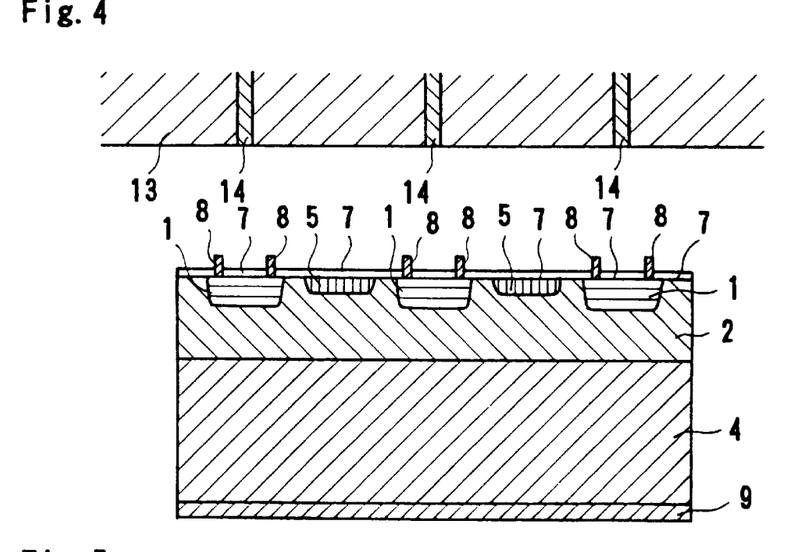
FIG. 4 is a sectional view of a PIN-PD array according to the second embodiment of the present invention.

FIG. 4 is a longitudinal sectional view of the PIN-PD array according to the second embodiment. A nondoped InGaAs absorption layer 2 ($n=1 \times 10^{15}$ $cm^{-3}$, thickness=5 $\mu m$) is formed on a $n^+$-type InP substrate 4. $P^+$-type regions 1 and 5 as regions of a second conductivity type are formed by selective diffusion of Zn. A p-side electrode 8 is formed on each $p^+$-type region 1, and an n-side electrode 9 is formed on the lower surface of the substrate 4.

An anti-reflection film 7 is formed on the upper surface of the absorption layer 2. Optical fibers 14 are aligned with light-detecting regions corresponding to the $p^+$-type regions 1 and their adjacent portions. In order to fix the optical fibers 14, an optical fiber connector 13 comprising two Si substrates on bottom and upper surfaces of which V grooves are formed is used. The optical fiber connector 13 is fixed to an appropriate plug which is similar to the plug 52 shown in FIG. 3. On the other hand, the PIN-PD array is fixed to an appropriate package which is similar to the package 51 shown in FIG. 3. The plug and the package of these types have been disclosed by S. R. Forrest (JOURNAL OF LIGHTWAVE TECHNOLOGY, VOL. LT-3, NO. 6, December, 1985, pp. 1248–1263).

In this embodiment, each $p^+$-type region 1 forms a PIN-PD structure serving as a light-detecting region. Each $p^+$-type region 5 has a crosstalk prevention function. Electric charges generated by light incident on a portion between the adjacent light-detecting regions are collected in the $p^+$-type region 5 and do not reach the $p^+$-type regions 1, thereby preventing crosstalk.

Figure 5:
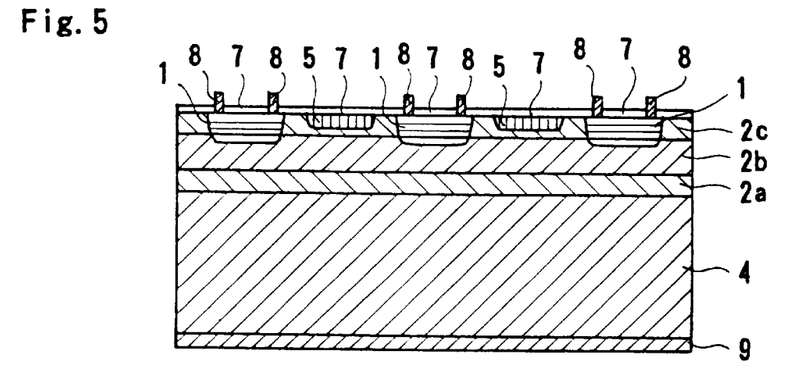
FIG. 5 is a sectional view of a PIN-PD array according to the third embodiment of the present invention.

FIG. 5 is a longitudinal sectional view of a PIN-PD array according to the third embodiment. The PIN-PD array of the third embodiment is a modification of the second embodiment. In this case, as a method of depleting an absorption layer, a region of a second conductivity type is formed at a position other than the absorption layer, and a depleted region around it extends into the absorption layer.

A nondoped InP buffer layer ($n=2 \times 10^{15}$ $cm^{-3}$, thickness=2 $\mu m$) 2a, a nondoped InGaAs ($n=2 \times 10^{15}$ $cm^{-3}$, thickness=3.5 $\mu m$) 2b, and a nondoped InP window layer ($n=2 \times 10^{15}$ $cm^{-3}$, thickness=2 $\mu m$) 2c are formed on an $n^+$-type InP substrate ($n=2 \times 10^{18}$ $cm^{-3}$) 4.

$P^+$-type regions 1 and 5 of a second conductivity type are formed by selective diffusion of Zn.

A p-side electrode 8 is formed on each $p^+$-type region 1, and an n-side electrode 9 is formed on the lower surface of the substrate 4.

In this embodiment, electric charges generated by stray light are collected in the $p^+$-type region 5 to prevent crosstalk. In addition, since the InP window layer 2c is stacked, a photosensitivity of the light-receiving device can be increased. An increase in photosensitivity involves a risk of crosstalk caused by stray light. However, stray light reaching the adjacent light-detecting regions due to multiple reflection can be shielded by the anti-reflection film 7 formed on the surface of the device, and at the same time, electric charges generated by the stray light can be collected in the $p^+$-type region 5. Therefore, crosstalk can be minimized while maintaining a high photosensitivity of each light-detecting region.

Figure 6:
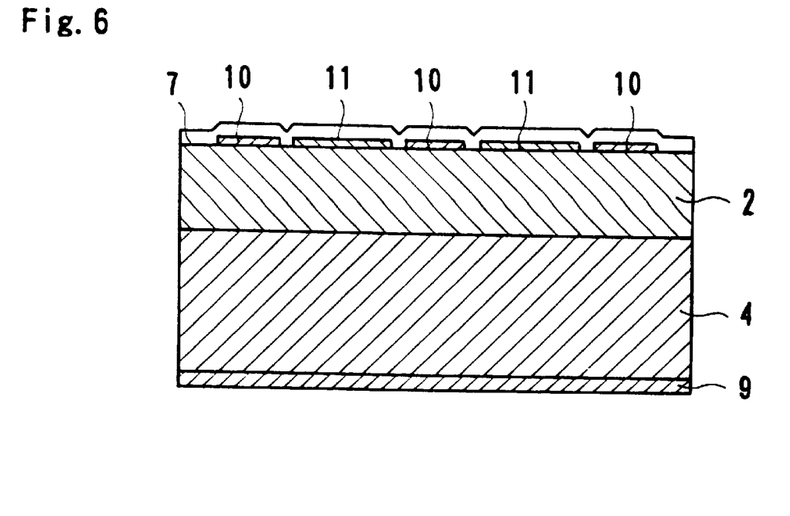
FIG. 6 is a sectional view of a Schottky diode array according to the fourth embodiment of the present invention.

FIG. 6 is a longitudinal sectional view of a Schottky diode array according to the fourth embodiment. The Schottky diode array of the fourth embodiment is a modification of the fourth embodiment. In this case, as a method of depleting an absorption layer, a Schottky electrode is formed on the absorption layer between the light-detecting regions.

After a nondoped Si absorption layer ($n=2 \times 10^{14}$ $cm^{-3}$, thickness=50 $\mu m$) 2 is grown on an $n^+$-type Si substrate ($n=2 \times 10^{18}$ $cm^{-3}$) 4, Schottky electrodes 10 are deposited on the absorption layer 2 to form Schottky diode structures which serve as light-detecting regions. Other Schottky electrodes 11 are deposited between adjacent light-detecting regions to deplete the absorption layer. An n-side electrode 9 is formed on the lower surface of the $n^+$-type Si substrate.

In this embodiment, an anti-reflection film 7 is formed on the surfaces of the absorption layer 2 and the Schottky electrodes, thereby preventing a decrease in photosensitivity due to reflection of incident light on the Schottky electrode surfaces. Since the anti-reflection film 7 is formed on the surfaces of the absorption layer 2 and the Schottky electrodes, propagation of stray light due to multiple reflection can be prevented. Thus, crosstalk caused upon incidence of stray light onto the adjacent light-detecting regions can be prevented.

In this embodiment, electric charges generated by stray light incident on portions between the adjacent light-detecting regions are collected in the Schottky electrodes 11, thus preventing crosstalk.

Semiconductor materials and their thicknesses in each of the above embodiments are not limited to those described there. More specifically, they can be arbitrarily selected according to, e.g., an objective wavelength. As for semiconductor materials, compound semiconductors such as GaAs, AlGaAs, CdTe, HgCdTe, InSb, and the like, or Si, Ge, and the like may be used. As an impurity, Be, Cd, or the like may be used in place of Zn.

Figure 7:
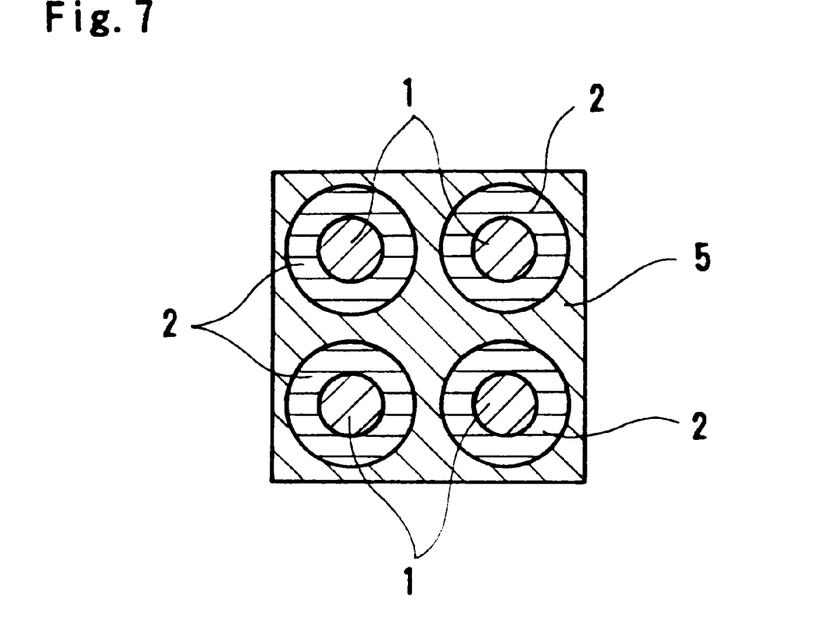
FIG. 7 is a plan view of a PIN-PD array according to the fifth embodiment of the present invention, and shows an array in which an arrangement of light-detecting regions is changed.

FIG. 7 is a plan view of a PIN-PD array according to the fifth embodiment. In this embodiment, a plurality of light-detecting regions are two-dimensionally formed on the array. A absorption layer 2 of a first conductivity type is grown on a semiconductor substrate, and an impurity is selectively diffused in a layer 2 to form regions 1 and 5 of second conductivity type. As shown in FIG. 7, the region 5 is formed to surround regions 1 which corresponds to the plurality of light-detecting regions. As a result, the absorption layer 2 around and between adjacent light-detecting regions is depleted. Therefore, the plurality of light-detecting regions can be formed in an arbitrary two-dimensional pattern.

Figure 8:
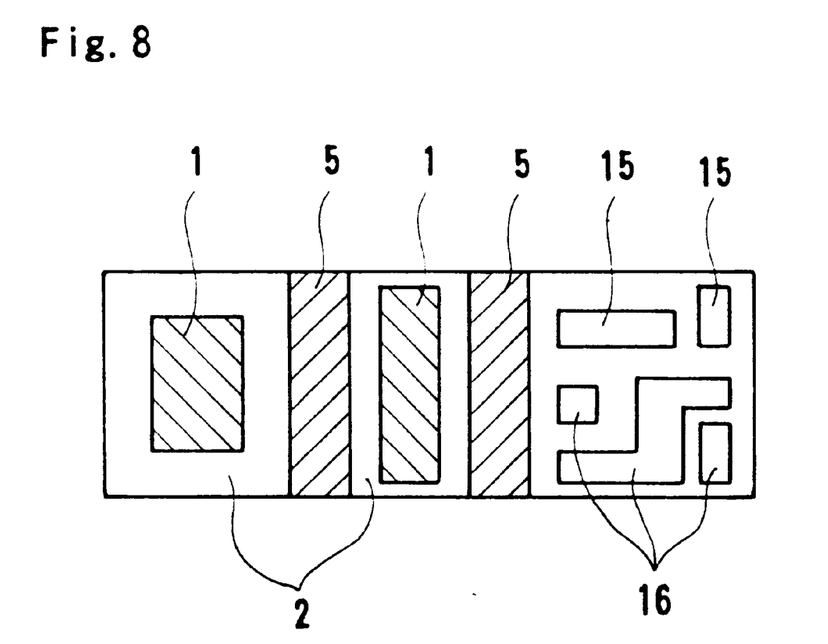
FIG. 8 is a plan view of a PIN-PD array according to the sixth embodiment of the present invention, and shows an array in which an electronic circuit is arranged adjacent to light-detecting regions.

FIG. 8 is a plan view of a PIN-PD array according to the sixth embodiment. Two light-detecting regions 1 of a second conductivity type are formed on a single semiconductor substrate, and regions 5 of the second conductivity type are formed between the regions 1 of the second conductivity type to form depletion regions for preventing crosstalk. In the PIN-PD array shown in FIG. 8, electronic circuits 15 and 16, e.g., FETs and the like for amplifying signals are formed on the single semiconductor substrate to be adjacent to the light-detecting regions 1. Since the region 5 of the second conductivity type is arranged between the region 1 of the second conductivity type and the electronic circuits 15 and 16, a portion therebetween is depleted, so that electric charges formed by stray light can be prevented from flowing into the electronic circuits 15 and 16 such as FETs.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

What is claimed is:

1. A light receiving device comprising;
    a semiconductor layer made of a first conductivity type InP;
    an absorption layer formed on the semiconductor layer and made of InGaAs;
    a window layer formed on said absorption layer and made of InP;
    a plurality of second conductivity diffused light detecting regions formed at and along predetermined portions of said window layer, each of said second conductivity diffused light detecting regions outputting an electric signal when a light signal is made incident into the respective light detecting region; and
    second conductivity diffused collecting regions formed at and below said window layer down to said absorption layer, said second conductivity diffused collecting regions being provided at portions of said window layer extending between adjacent ones of said second conductivity diffused light detecting regions;
    wherein said second conductivity collecting regions penetrate said window layer to reach said light detecting regions; and
    one of the collecting regions is provided towards an edge of said device and a boundary between said one collecting region and said absorption layer is exposed to an edge surface of the device.

2. A device according to claim 1, wherein said light receiving device further comprises a single electrode adapted for connection to an external terminal, said electrode being electrically connected to said second conductivity diffused collecting regions.

3. A device according to claim 2, wherein said second conductivity diffused light detecting regions are arranged in an array, and output electrodes of said second conductivity diffused light detecting regions are alternately arranged along two sides of the array.

4. A device according to claim 3, wherein an anti-reflection film is formed over said portions extending between adjacent ones of said second conductivity diffused light detecting regions.

5. A device according to claim 2, wherein said light receiving device further comprises an anti-reflection film formed over said portions extending between adjacent ones of said second conductivity diffused light detecting regions.

6. A device according to claim 1, wherein an anti-reflection film is formed over said portions extending between adjacent ones of said second conductivity diffused light detecting regions.

7. A device according to claim 1, wherein said second conductivity diffused light detecting regions are arranged in an array, and output electrodes of said second conductivity diffused light detecting regions are alternately arranged along two sides of the array.

8. A device according to claim 7, wherein an anti-reflection film is formed over said portions extending between adjacent ones of said second conductivity diffused light detecting regions.

9. A device according to claim 1, wherein said second conductivity diffused light detecting regions are two dimensionally arranged, and said second conductivity diffused light detecting regions are laterally interspersed between and collectively surrounded by said second conductivity diffused collecting regions.

10. A device according to claim 1, wherein said second conductivity diffused light detecting regions are arranged adjacent to a semiconductor circuit.

11. A device according to claim 1, wherein said second conductivity diffused collecting regions are electrically connected to each other and said second conductivity diffused light detecting regions are arranged in an array, and output electrodes of said second conductivity diffused light detecting regions are alternately arranged along two sides of the array.

12. An optical connector comprising:
    a semiconductor layer made of a first conductivity type InP;
    an absorption layer formed on the semiconductor layer and made of InGaAs;
    a window layer formed on said absorption layer and made of InP;
    a plurality of second conductivity diffused light detecting regions formed at and along predetermined portions of said window layer, each of said second conductivity diffused light detecting regions outputting an electric signal when a light signal is made incident into the respective light detecting region;
    second conductivity diffused collecting regions formed at and below said window layer down to said absorption layer, said second conductivity diffused collecting regions being provided at portions of said window layer extending between adjacent ones of said second conductivity diffused light detecting regions wherein said second conductivity collecting regions penetrate said window layer to reach said light detecting regions, one of the collecting regions is provided towards an edge of said device, and a boundary between said one collecting region and said absorption layer is exposed to an edge surface of the device;
    a housing for storing a light receiving device; and
    a plurality of terminals fixed to said housing, each electrically connected to corresponding one of said second conductivity diffused light detecting regions.

13. An optical connector comprising:
    a semiconductor layer made of a first conductivity type InP;

an absorption layer formed on the semiconductor layer and made of InGaAs;

a window layer formed on said absorption layer and made of InP;

a plurality of second conductivity diffused light detecting regions formed at and along predetermined portions of said window layer, each of said second conductivity diffused light detecting regions outputting an electric signal when a light signal is made incident into the respective light detecting region;

second conductivity diffused collecting regions formed at and below said window layer down to said absorption layer, said second conductivity diffused collecting regions being provided at portions of said window layer extending between adjacent ones of said second conductivity diffused light detecting regions wherein said second conductivity collecting regions penetrate said window layer to reach said light detecting regions, one of the collecting regions is provided towards an edge of said device, and a boundary between said one collecting region and said absorption layer is exposed to an edge surface of the device;

a housing for storing a light receiving device;

a plurality of terminals fixed to said housing, each electrically connected to corresponding one of said plurality of light detecting regions; and optical fiber holding means for fixing a plurality of optical fibers and optically coupling each optical fiber to an associated one of said second conductivity diffused light detecting regions.

14. An optical connector according to claim 13, further comprising an electrode adapted for connection to an external terminal and for electrically contacting with said second conductivity diffused collecting regions, said housing including an output terminal electrically connected with said electrode.

15. An optical connector according to claim 13, wherein said optical fiber holding means is positioned to direct respective distal ends of the optical fibers toward a lateral surface of associated ones of said second conductivity diffused light detecting regions.

* * * * *